(12) United States Patent
Wu et al.

(10) Patent No.: US 8,198,107 B2
(45) Date of Patent: Jun. 12, 2012

(54) METHOD FOR MANUFACTURING LIGHT EMITTING DIODE ASSEMBLY

(75) Inventors: Chien-Jung Wu, Taipei (TW); Tsung-Ting Sun, Taipei (TW)

(73) Assignee: Edison Opto Corporation, Taipei Hsien (TW)

(*) Notice: Subject to any disclaimer, the term of this patent is extended or adjusted under 35 U.S.C. 154(b) by 437 days.

(21) Appl. No.: 12/574,799

(22) Filed: Oct. 7, 2009

(65) Prior Publication Data
US 2011/0081737 A1    Apr. 7, 2011

(51) Int. Cl.
*H01L 21/00* (2006.01)
(52) U.S. Cl. ............... 438/26; 438/29; 257/E33.057
(58) Field of Classification Search ........... 257/E33.057, 257/E33.059, E33.062; 438/26, 29
See application file for complete search history.

(56) References Cited

U.S. PATENT DOCUMENTS

| 6,642,072 B2 * | 11/2003 | Inoue et al. ............ 438/26 |
| 2007/0096130 A1 * | 5/2007 | Schiaffino et al. ....... 257/98 |

* cited by examiner

*Primary Examiner* — Matthew Landau
*Assistant Examiner* — Daniel Luke
(74) *Attorney, Agent, or Firm* — Rosenberg, Klein & Lee

(57) ABSTRACT

A method for manufacturing a light emitting diode (LED) assembly comprises the steps of: covering a light-reflection layer onto a substrate layer, covering a light-emitting layer onto the light-reflection layer, and forming a P type electrode and an N type electrode extended from the light-emitting layer, perforating through the light-reflection layer, and exposed from the substrate layer to form an LED chip structure; packaging the LED chip structure with a light-transmissible packaging material and keeping the P type electrode and the N type electrode exposed from the light-transmissible packaging material to form a molded LED chip cell; and electrically connecting the P type electrode and the N type electrode of the molded LED chip cell to a circuit board, so as to manufacture the LED assembly.

9 Claims, 9 Drawing Sheets

METHOD FOR MANUFACTURING LIGHT EMITTING DIODE ASSEMBLY

FIELD OF THE INVENTION

The present invention relates to a method for manufacturing a light emitting diode (LED) assembly, and more particularly to the method for manufacturing the LED assembly with an molded LED chip cell directly mounted on a circuit board.

BACKGROUND OF THE INVENTION

In daily life, for identifying objects and directions in dark environment, it is usually necessary to provide illumination for us via the utilization of a light emitting assembly. Among the light emitting assemblies, LED has become the most popular light emitting assembly gradually due to global energy saving trend and its advantages of long usage life and low power consumption.

However, besides the usage of wide-field illumination, due to that the LED has the advantages of long usage life and low power consumption, LED is also usually applied to be assembled into the LED assembly to provide for the backlight of the electronic devices or for other utilization. Among numerous LED assemblies, the technology of chip-flipping is to directly mount a packaged LED structure to a carrier without wire-bonging, so that it is widely used by the most people skilled in the arts.

Based on the background as mentioned, following up, a representative technology for manufacturing an LED assembly via manufacturing a chip-flipped type packaged LED structure in prior art is disclosed for more detail illustration. Please refer to the drawings from FIG. 1A to FIG. 1E, which illustrate a series of steps for manufacturing the LED assembly in the prior art. As shown in FIG. 1A, when manufacturing a chip-flipped type packaged LED structure 100 (shown in FIG. 1E), firstly, it is necessary to prepare a flipped-type LED structure 1. At this step, it is necessary to prepare a substrate as a light-transmissible substrate layer 11.

Following up, it is necessary to form a buffer layer, 12 an N type electrode cladding sub-layer 13, a multiple quantum well 14, a P type electrode cladding sub-layer 15, a light-transmissible conductive film 16 and a reflection layer 17.

The buffer layer 12 covers the light-transmissible substrate layer 11; the N type electrode cladding sub-layer 13 covers the buffer layer 12; the multiple quantum well 14 covers the N type electrode cladding sub-layer 13; the P type electrode cladding sub-layer 15 covers the multiple quantum well 14; the light-transmissible conductive film 16 covers the P type electrode cladding sub-layer 15; and the reflection layer 17 covers the light-transmissible conductive film 16. Next, it is necessary to make a P type electrode 18 be extended from the light-transmissible conductive film 16, and make an N type electrode 19 be extended from the N type electrode cladding sub-layer 13. Moreover, it is able to plate gold (Au), tin (Sn) or gold-tin (Au—Sn) alloy (not shown) on the P type electrode 18 and the N type electrode 19, so as to manufacture the flipped-type LED structure 1.

As shown in FIG. 1B, next, it is necessary to prepare a carrier 2 comprising a carrier body 21, a P type electrode layer 22 and an N type electrode layer 23. The carrier body 21 has a top surface 211, a bottom surface 212, a first side 213 and a second side 214. The P type electrode layer 22 and the N type electrode layer 23 are respectively arranged to wrap the first side 213 and the second side 214.

As shown in FIG. 1C, after preparing the carrier 2, it is necessary to respectively arrange two conductive members 3 and 3a on the P type electrode 22 and the N type electrode 23 of the carrier 2. Preferably, the conductive members 3 and 3a can be soldering contacts made on the carrier, and the soldering contacts can be made by plating gold or silver.

As shown in 1D, when the conductive members 3 and 3a are the soldering contacts made by plating gold or silver, it is necessary to flip the flipped-type LED structure 1 to execute an eutectic process under an eutectic temperature, so as to make the gold and silver element particles of the conductive elements 3 and 3a permeate into the gold, tin or gold-tin alloy plated on the P type electrode 18 and N type electrode 19. Through the eutectic process, it is able to make the P type electrode 18 and N type electrode 19 of the flipped-type LED structure 1 be electrically connected to the P type electrode layer 22 and N type electrode layer 23 of the carrier 2 respectively via the conductive elements 3 and 3a. In practice, the conductive members 3 and 3a also can be gold (Au), tin (Sn) or gold-tin (Au—Sn) alloy deposited on the carrier 2, and it is also able to form soldering contacts made by plating gold or silver on the P type electrode 18 and the N type electrode 19, so as to execute the eutectic process as mentioned. Except for above method, when the conductive members 3 and 3a are tin balls or tin paste, through a reflow soldering process, the P type electrode 18 and N type electrode 19 also can be electrically connected to the P type electrode layer 22 and N type electrode layer 23 respectively via the conductive elements 3 and 3a.

As shown in FIG. 1E, after electrically connecting the P type electrode 18 and N type electrode 19 to the P type electrode layer 22 and N type electrode layer 23 respectively, it is necessary to execute a packaging process of packaging the flipped-type LED structure 1, the conductive members 3 and 3a by a light-transmissible packaging material 4, so as to manufacture the flipped-type packaged LED structure 100 after the light-transmissible packaging material 4 is cured. Finally, it is necessary to mount the flipped-type packaged LED structure 100 onto a circuit board (not shown) by soldering, and then an LED assembly (not shown) is manufactured.

Any person skilled in ordinary art can easily make out that in the prior art as disclosed, it is necessary to electrically connect the P type electrode 18 and N type electrode 19 of the flipped-type LED structure 1 to the P type electrode layer 22 and N type electrode layer 23 firstly, and then fill the light-transmissible packaging material 4 to the flipped-type LED structure 1, the conductive members 3 and 3a; therefore, it is very inconvenient that it is necessary to execute both the eutectic process and the packaging process to manufacture the flipped-type packaged LED structure 100, and then to mount the flipped-type packaged LED structure 100 on the circuit by soldering.

Nevertheless, due to that it is necessary to apply a filling pressure to a die when filling the light-transmissible packaging material 4 therein, it would bring the problem that the light-transmissible packaging material 4 overflows to the carrier 2; moreover, the defective rate of electrical connection between the conductive members 3, 3a and the carrier 2 would be increased due to that the conductive members 3 and 3a would be pressed when suffering the filling pressure.

Based on the background, the inventor of the present invention is of the opinion that it is necessary to provide a new method for manufacturing a LED assembly, so as to improve the problems as mentioned above.

SUMMARY OF THE INVENTION

Due to that the method for manufacturing the flipped-type packaged LED structure as provided in the prior art exists the problems of that it brings the inconvenience of executing a series of complex processes including both the eutectic process and the packaging process, causes the light-transmissible packaging material overflowing to the carrier, and increases the defective rate of electrical connection between the conductive members and the carrier. Thus, the primary objective of the present invention is to provide a method for manufacturing a LED assembly, by which a packaging process of manufacturing a molded LED chip cell is executed to make a P type electrode and an N type electrode exposed thereof, so as to replace the flipped-type packaged LED structure to directly mounted on a circuit board. Though the method, the problems as mentioned can be effectively solved.

Means of the present invention for solving the problems as mentioned above is to provide a method for manufacturing a light emitting diode (LED) assembly, and the method comprises the steps of: covering a light-reflection layer onto a substrate layer, covering a light-emitting layer onto the light-reflection layer, and forming a P type electrode and an N type electrode extended from the light-emitting layer, perforating through the light-reflection layer, and exposed from the substrate layer to form an LED chip structure; packaging the LED chip structure with a light-transmissible packaging material and keeping the P type electrode and the N type electrode exposed from the light-transmissible packaging material to form a molded LED chip cell; and electrically connecting the P type electrode and the N type electrode of the molded LED chip cell to a circuit board, so as to manufacture the LED assembly.

In the preferred embodiment of the present invention, the LED chip structure comprises a substrate layer, a reflection layer, a light-transmissible conductive sub-layer, a P type electrode cladding sub-layer, a light-transmissible multiple quantum well and an N type electrode cladding sub-layer. The reflection layer covers the substrate layer, the light-transmissible conductive sub-layer covers the reflection layer, the P type electrode cladding sub-layer covers the light-transmissible conductive sub-layer, the light-transmissible multiple quantum well covers the P type electrode cladding sub-layer, and the N type electrode cladding sub-layer covers the light-transmissible multiple quantum well. The light-transmissible conductive sub-layer, the P type electrode cladding sub-layer, the light-transmissible multiple quantum well and the N type electrode cladding sub-layer can be viewed as the light-emitting layer.

Comparing with the conventional method for manufacturing the LED assembly via manufacturing a chip-flipped type packaged LED structure in prior art, in the present invention, a packaging process of manufacturing a molded LED chip cell is executed to make a P type electrode and an N type electrode exposed thereof, so that the molded LED chip cell can be applied to replace the flipped-type packaged LED structure to directly mounted on a circuit board to manufacture the LED assembly. Obviously, through the method as provided in the present invention, it is more convenient to manufacture the LED assembly.

In the method for manufacturing the LED assembly as disclosed in the present invention, it is unnecessary to use the carrier; therefore, there is no problem of that the light-transmissible packaging material overflows to the carrier in the whole manufacturing steps. Furthermore, there would be less electrical connection defection of the molded LED chip cell caused by filling the light-transmissible packaging material to the LED chip structure to form the molded LED chip cell. By the way, it is able to make the overall dimension of molded LED chip cell approaching to the overall dimension of the LED chip structure, i.e., it is able to make the overall dimension of the molded LED chip cell be much less than the overall dimension of the flipped type packaged LED structure as provided in the prior art, so as to increase the space utilization rate of that the molded LED chip cells are arranged on the circuit board.

To make a summary, through the method as provided in the present invention, it not only can make the manufacturing of the LED assembly become more convenient, but also can upgrade the quality of the manufacturing the LED assembly. By the way, through the method as provided in the present invention, it also can effectively increase the space utilization rate of that the molded LED chip cells are arranged on the circuit board.

The devices, characteristics, and the preferred embodiment of this invention are described with relative figures as follows.

BRIEF DESCRIPTION OF THE DRAWINGS

The structure and the technical means adopted by the present invention to achieve the above and other objectives can be best understood by referring to the following detailed description of the preferred embodiments and the accompanying drawings, wherein.

DETAILED DESCRIPTION OF THE PREFERRED EMBODIMENTS

The method for manufacturing LED assembly as provided in accordance with the present invention can be widely applied to manufacture many kinds of LED assemblies, and the combined applications of the present invention are too numerous to be enumerated and described, so that only one preferred embodiment is disclosed as follows for representation.

Figure 1A:
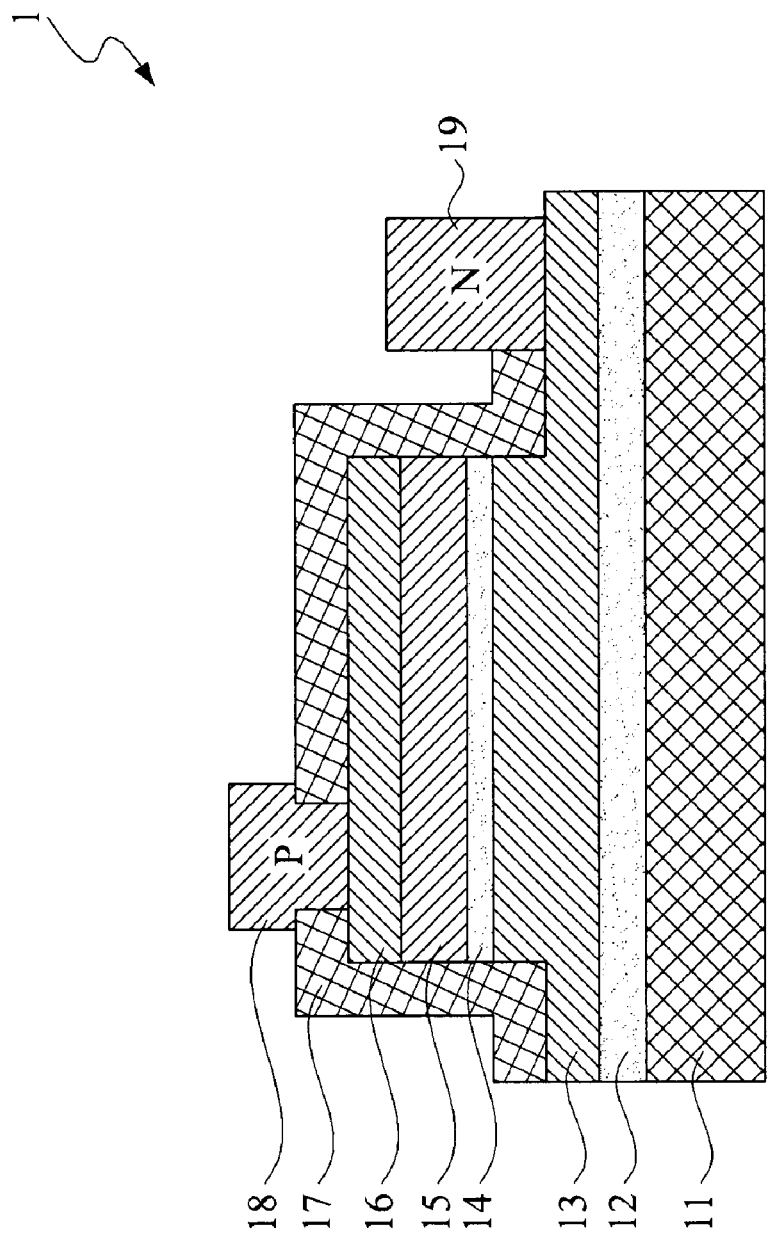
FIG. 1A to FIG. 1E illustrate a series of steps for manufacturing the LED assembly in the prior art.
Figure 1B:
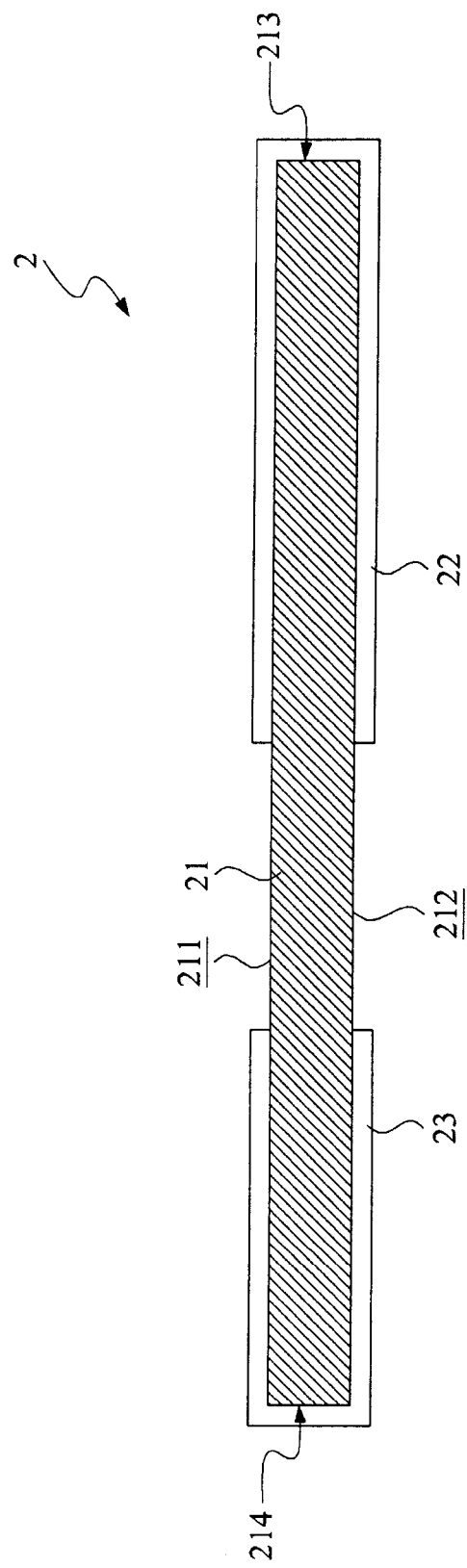
Figure 1C:
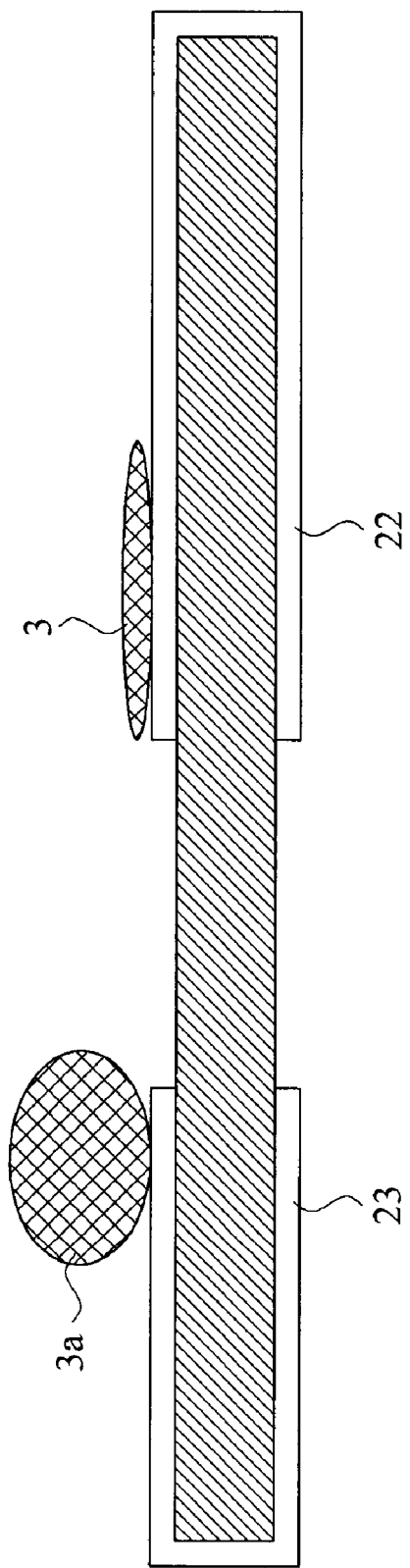
Figure 1D:
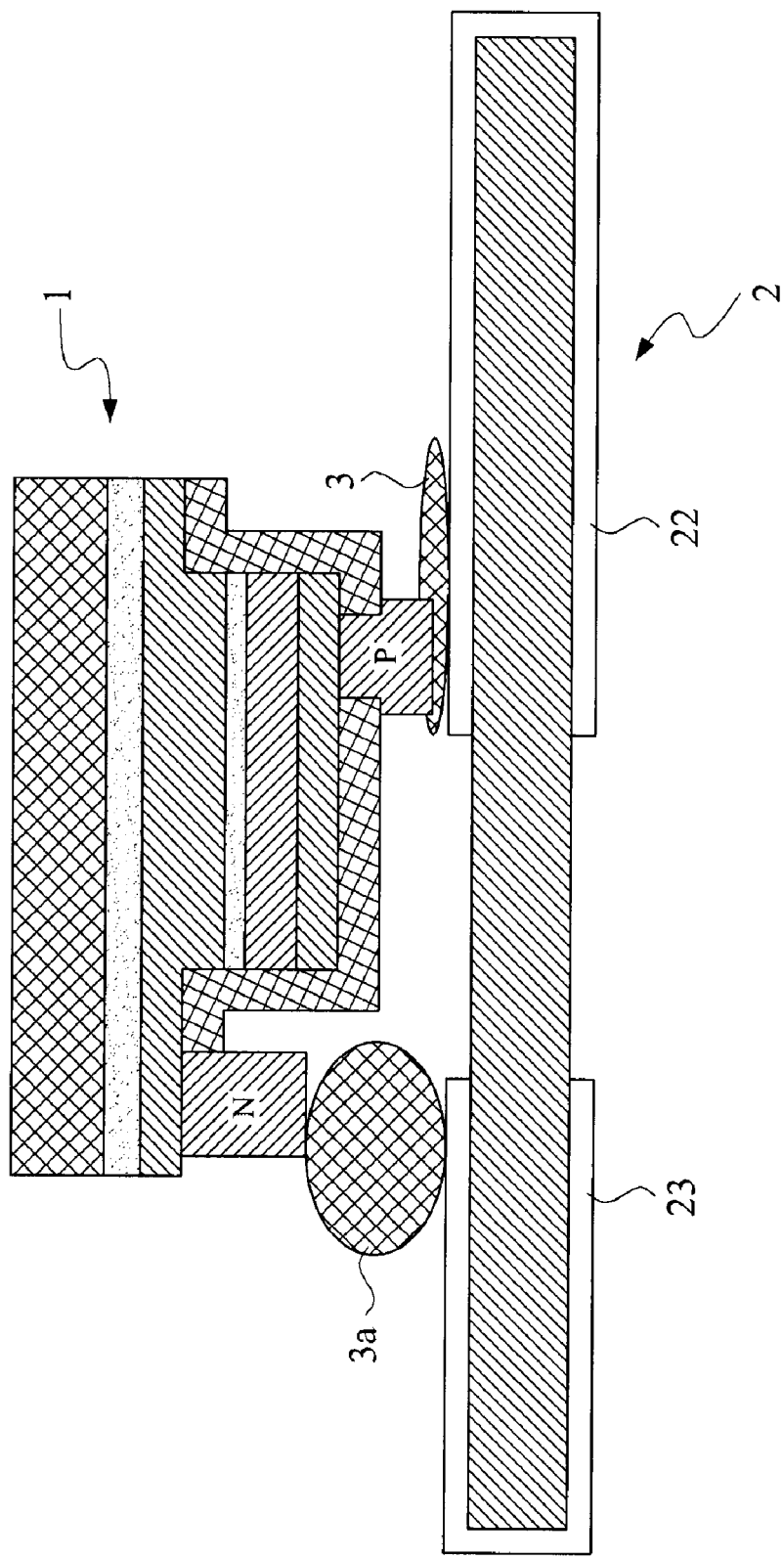
Figure 1E:
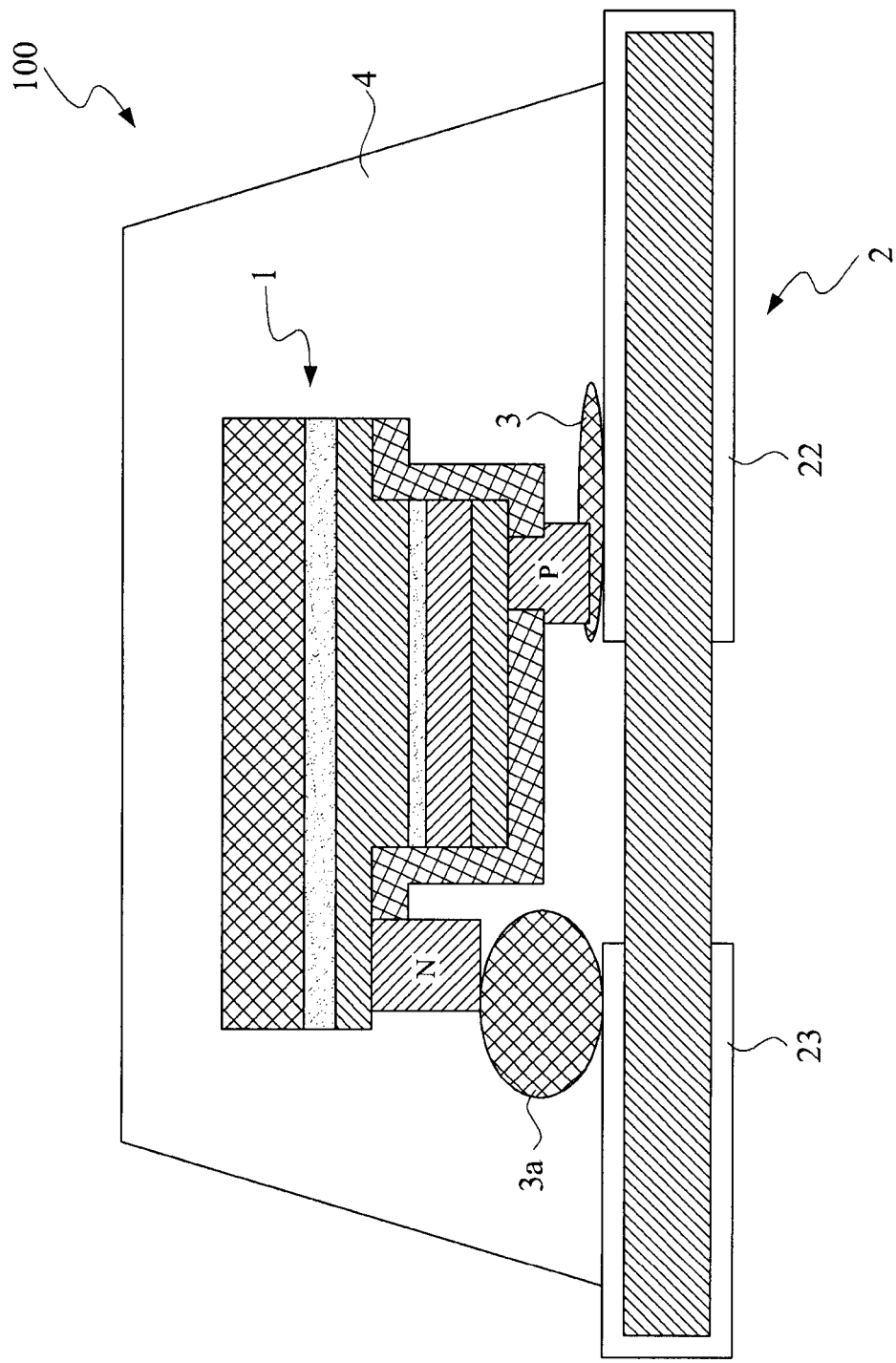
Figure 2A:
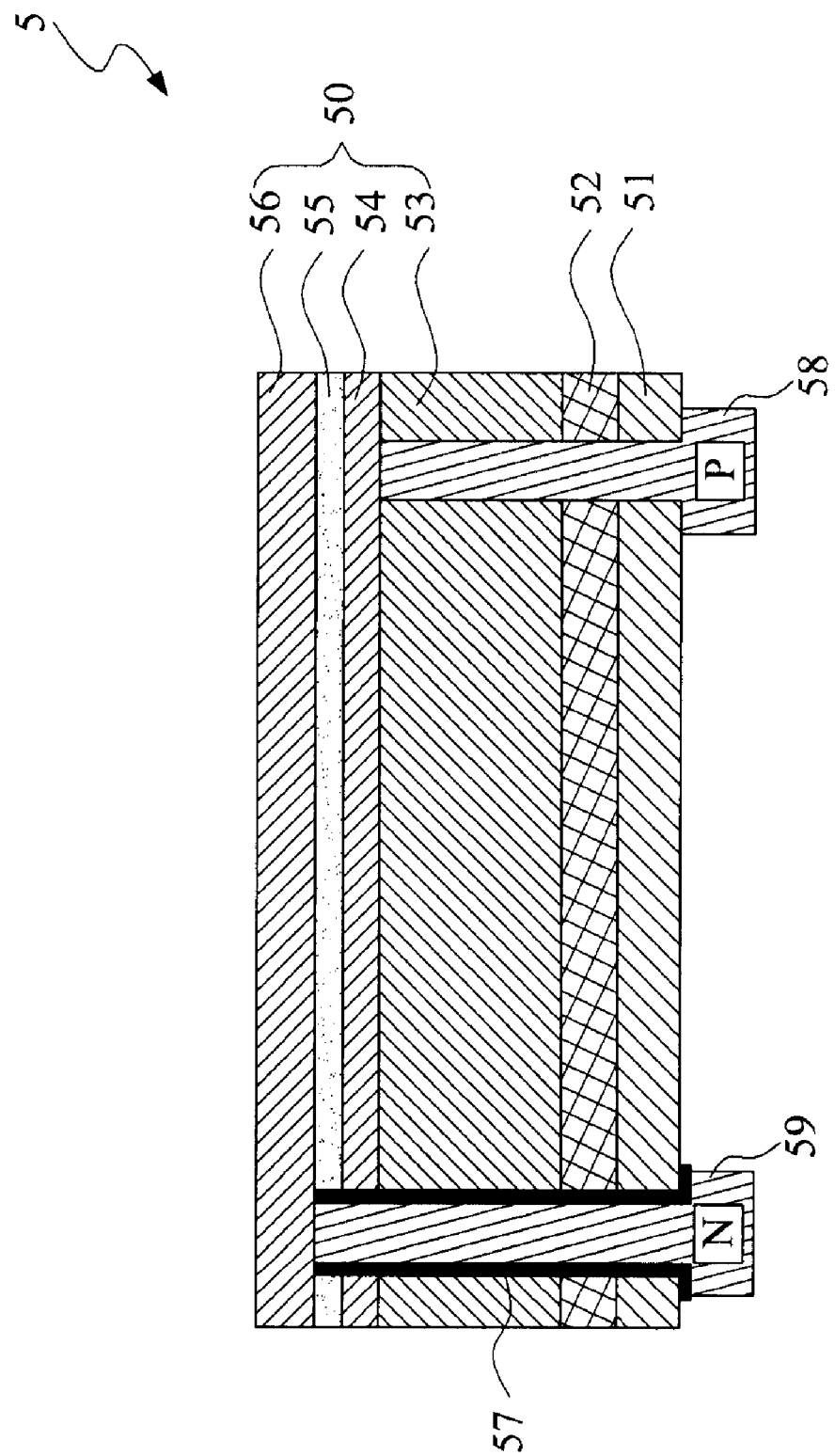
FIG. 2A illustrates the step of manufacturing an LED chip structure in the preferred embodiment of the present invention.

Please refer to the drawings from FIG. 2A to FIG. 2D, which illustrate a series of steps for manufacturing the LED assembly in accordance with the preferred embodiment of the present invention. The most important concept, which is disclosed in the preferred embodiment of the present invention, is to manufacture a molded LED chip cell 200 (shown in FIG. 2B) firstly, and then to manufacture a LED assembly 300 (shown in FIG. 2D). As shown in FIG. 2A, which illustrates the step of manufacturing an LED chip structure in the preferred embodiment of the present invention. When manufacturing the molded LED chip cell 200, it is necessary to manufacture an LED chip structure 5. At this moment, it is necessary to prepare a substrate as a substrate layer 51.

Next, following up it is necessary to form the a reflection layer 52, a light-transmissible conductive sub-layer 53, a P type electrode cladding sub-layer 54, a light-transmissible multiple quantum well 55 and an N type electrode cladding sub-layer 56. The reflection layer 52 covers the substrate layer 51, the light-transmissible conductive sub-layer 53 covers the reflection layer 52, the P type electrode cladding sub-layer 54 covers the light-transmissible conductive sub-layer 53, the light-transmissible multiple quantum well 55 covers the P type electrode cladding sub-layer 54, and the N type electrode cladding sub-layer 56 covers the light-transmissible multiple quantum well 55. The light-transmissible conductive sub-layer 53, the P type electrode cladding sub-layer 54, the light-transmissible multiple quantum well 55 and the N type electrode cladding sub-layer 56 can be viewed as a light-emitting layer 50.

The substrate layer 51 can be a substrate composed of at least one material of silicon carbide (SiC), aluminum oxide ($Al_2O_3$), gallium arsenide (GaAs), silicon (Si), sapphire, copper (Cu), copper-tungsten (Cu—W) alloy and gallium phosphide (GaP). The reflection layer 52 is composed of at least one compound of titanium dioxide and silicon dioxide ($TiO_2$/$SiO_2$), aluminum oxide and silicon dioxide ($Al_2O_3$/$SiO_2$), and Silicon Nitride and silicon dioxide ($Si_3N_4$/$SiO_2$). The light-transmissible conductive sub-layer 53 is formed by an annealing process for a Nickel-Gold (Ni—Au) metal film under the annealing temperature of 500° C. to 550° C.

Next, it is necessary to bore, via etching or drilling, a P type electrode extension recess (not shown) and an N type electrode extension recess from the substrate layer 51 toward the light-emitting layer 50, wherein the P type electrode extension recess is bored to contact with the P type electrode cladding sub-layer 54, and the N type electrode extension recess is bored to contact with the N type electrode cladding sub-layer 56 and isolated by an isolation film 57. Then, it is necessary to make a P type electrode 58 be extended from the P type electrode cladding sub-layer 54, perforating the light-transmissible conductive sub-layer 53, the reflection layer 52 and the substrate layer 51 via the P type electrode extension recess, and exposed from the substrate layer 51. Meanwhile, it is necessary to make an N type electrode 59 be extended from the N type electrode cladding sub-layer 56, perforating the light-transmissible multiple quantum well 55, the P type electrode cladding sub-layer 54, the light-transmissible conductive sub-layer 53, the reflection layer 52 and the substrate layer 51 via the P type electrode extension recess, and exposed from the substrate layer 51. Thus, through the isolation film 57, the N type electrode 59 can keep electrical isolation with respect to the light-transmissible multiple quantum well 55, the P type electrode cladding sub-layer 54, the light-transmissible conductive sub-layer 53, the reflection layer 52 and the substrate layer 51. Up to now, the manufacturing of the LED chip structure 5 is finished.

Figure 2B:
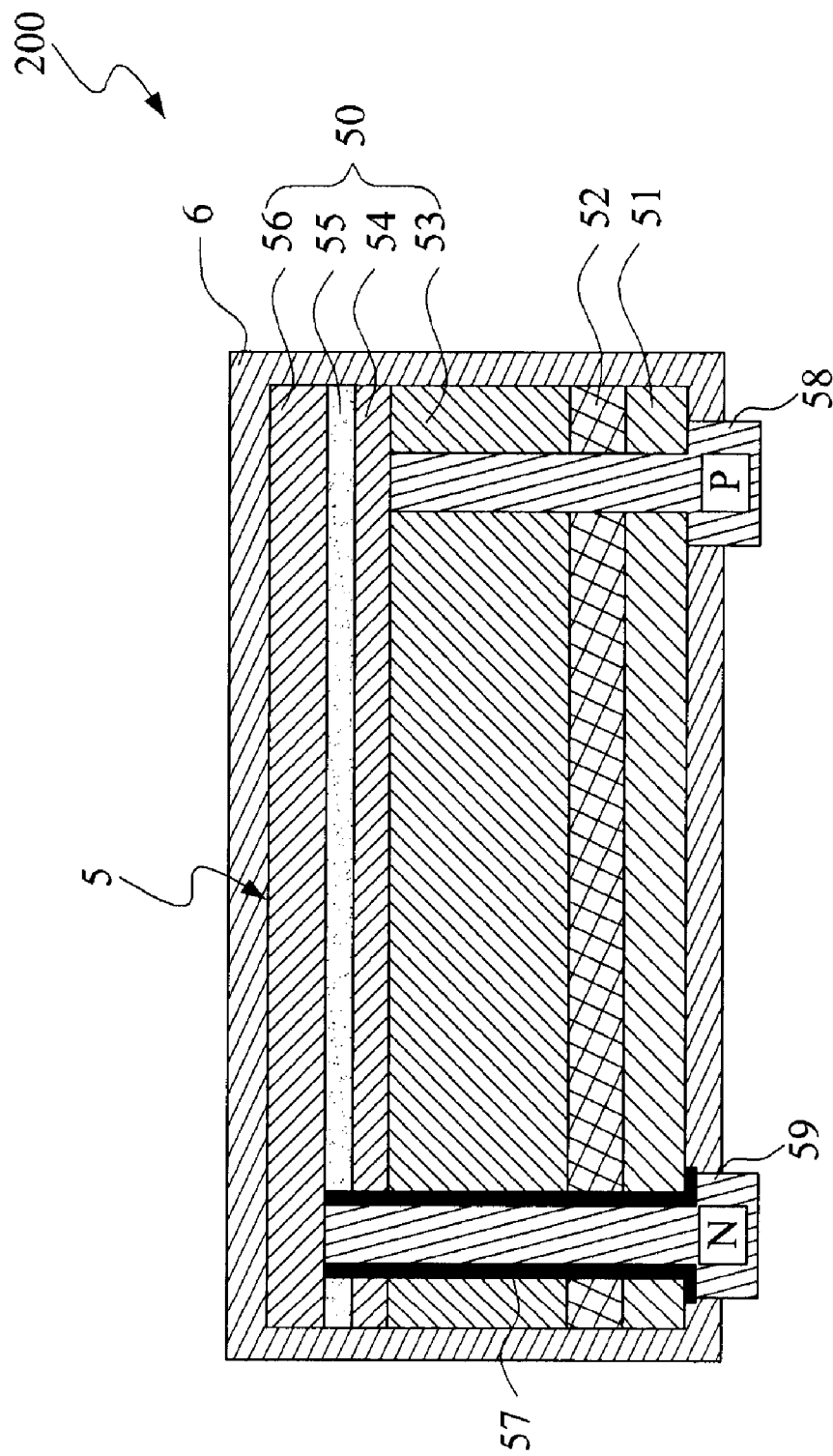
FIG. 2B, which illustrates the step of packaging the LED chip structure to manufacture the molded LED chip cell in accordance with the preferred embodiment of the present invention.

As shown in FIG. 2B, which illustrates the step of packaging the LED chip structure to manufacture the molded LED chip cell in accordance with the preferred embodiment of the present invention. After manufacturing the LED chip structure 5, a packaging process can be executed. When executing the packaging process, a light-transmissible packaging material 6, such as light-transmissible packaging gel or rubber, is applied to package the LED chip structure 5 to keep the P type electrode 58 and the N type electrode 59 being exposed of the light-transmissible packaging material 6, after the light-transmissible packaging material 6 is cured, the manufacturing of the molded LED chip cell 200 is finished.

Figure 2C:
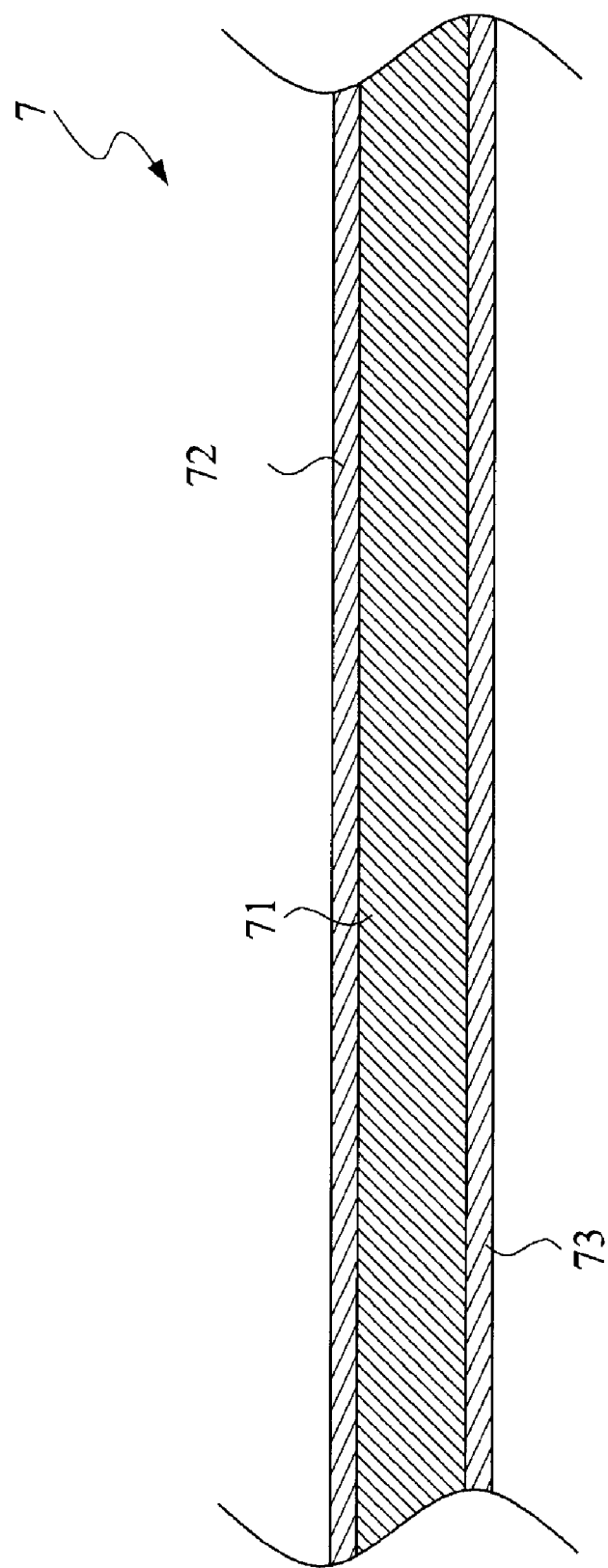
FIG. 2C illustrates the step of preparing a circuit board in accordance with the preferred embodiment of the present invention.

As shown in FIG. 2C, which illustrates the step of preparing a circuit board in accordance with the preferred embodiment of the present invention. Before manufacturing the LED assembly 300 (shown in FIG. 2D), it is necessary to prepare a circuit board 7 comprising a substrate layer 71, a first circuit arrangement layer 72 and a second circuit arrangement layer 73. The first circuit arrangement layer 72 and the second circuit arrangement layer 73 are deposited on two surfaces, opposite to each other, of the substrate layer 71, and at least one of the first circuit arrangement layer 72 and the second circuit arrangement layer 73 is arranged with a LED driving/control circuit (not shown). In the preferred embodiment, the LED driving/control circuit is arranged on the first circuit arrangement layer 72. Preferably, the circuit board 7 can be a printed circuit board, such as an FR4 (an abbreviation for Flame Retardant 4) copper clad laminate, or any other circuit board arranged with the LED driving/control circuit.

Figure 2D:
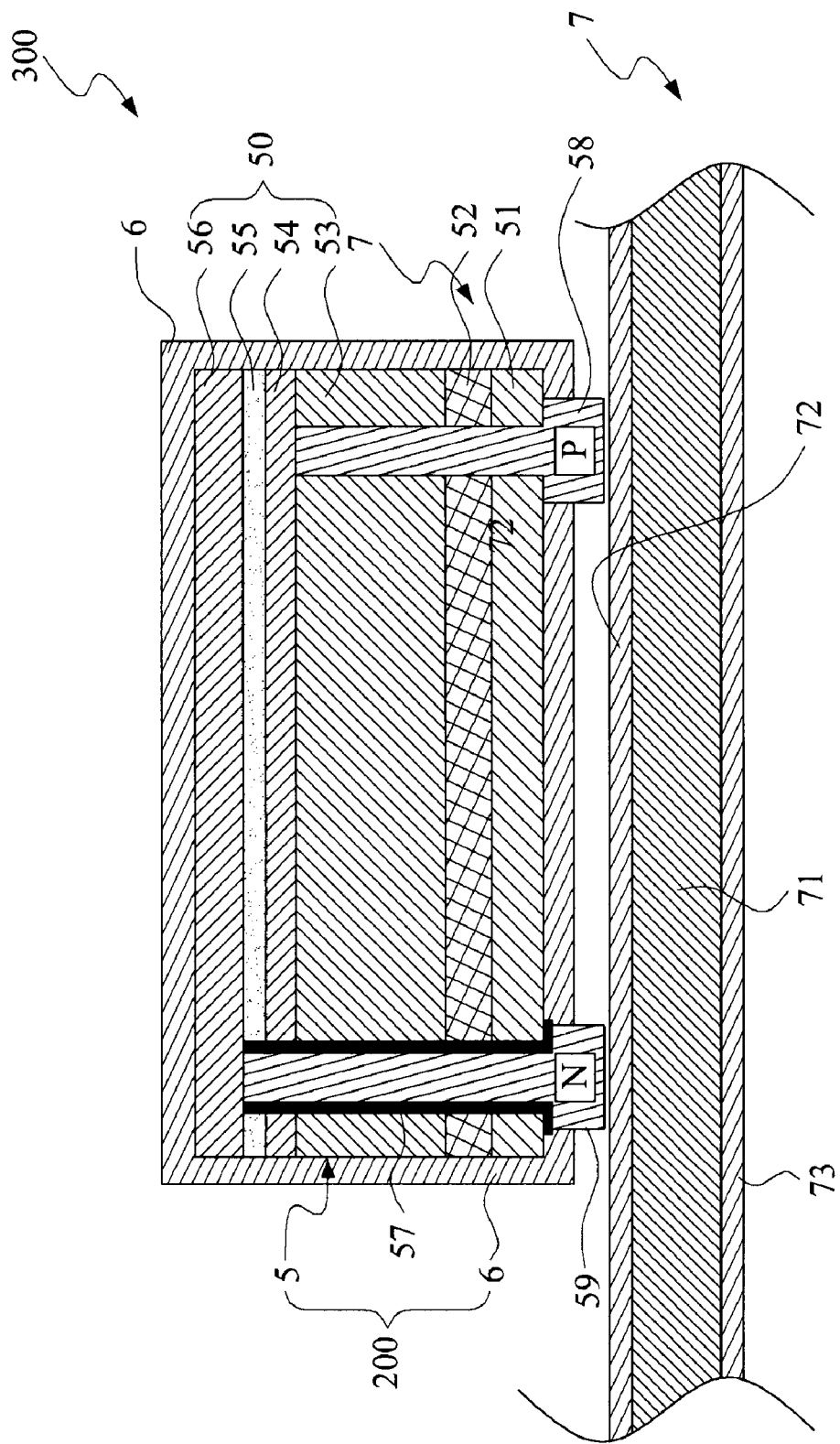
FIG. 2D illustrates the step of mounting the molded LED chip cell on the circuit board by a soldering process in accordance with the preferred embodiment of the present invention.

As shown in FIG. 2D, which illustrates the step of mounting the molded LED chip cell on the circuit board by a soldering process in accordance with the preferred embodiment of the present invention. After preparing the circuit board 7, it is able to mount the molded LED chip cell thereon to make the P type electrode 58 and the N type electrode 59 be electrically connected to the LED driving/control circuit arranged on the first circuit arrangement layer 72 respectively. After finishing the soldering process, the manufacturing of the LED assembly is finished. More preferably, when executing the soldering process, a melted or partial-melted soldering ball or soldering paste made of tin can be applied to attach to the P type electrode 58 and the N type electrode 59, or be applied to attach to the soldering pin, contact or pad of the LED driving/control circuit arranged on the first circuit arrangement layer 72, and then a reflow soldering and low-temperature solidification process can be executed.

After reading the technology as disclosed above, it is believable that any person skilled in ordinary art can reasonably make out that in the method for manufacturing the LED assembly 300 in accordance with the present invention, the packaging process of manufacturing the molded LED chip cell 200 is executed to make the P type electrode 58 and the N type electrode exposed thereof, so that the molded LED chip cell 200 can be applied to replace the flipped-type packaged LED structure to directly mounted on a circuit board to manufacture the LED assembly. Obviously, through the method as provided in the present invention, it is more convenient to manufacture the LED assembly.

In the method for manufacturing the LED assembly 300 as disclosed in the present invention, it is unnecessary to use the carrier 2 as disclosed in the prior art; therefore, there is no problem of that the light-transmissible packaging material 6 overflows to the carrier 2 in the whole manufacturing steps. Furthermore, there would be less electrical connection defection of the molded LED chip cell 200 caused by filling the light-transmissible packaging material 6 to the LED chip structure to form the molded LED chip cell 200. By the way, it is able to make the overall dimension of molded LED chip cell 200 approaching to the overall dimension of the LED chip structure 5, i.e., it is able to make the overall dimension of the molded LED chip cell 200 be much less than the overall dimension of the flipped type packaged LED structure 100 as provided in the prior art, so that more molded LED chip cell(s) 200 can be mounted to the circuit board to increase the space utilization rate of that the molded LED chip cell(s) 200 are arranged on the circuit board 7.

To make a summary, through the method as provided in the present invention, it not only can make the manufacturing of the LED assembly 300 become more convenient, but also can upgrade the quality of the manufacturing the LED assembly 300. By the way, through the method as provided in the present invention, it also can effectively increase the space utilization rate of that the molded LED chip cells 200 are arranged on the circuit board 7.

Although the present invention has been described with reference to the preferred embodiments thereof, it is apparent to those skilled in the art that a variety of modifications and changes may be made without departing from the scope of the present invention which is intended to be defined by the appended claims.

What is claimed is:

1. A method being applied to manufacture a light emitting diode (LED) assembly comprising the steps of:
   (a) covering a reflection layer onto a substrate layer, and covering a light emitting layer onto the reflection layer;
   (b) forming a P type electrode and an N type electrode extended from the light-emitting layer, perforating through the reflection layer, and exposed from the substrate layer to form an LED chip structure;
   (c) packaging the LED chip structure with a light-transmissible packaging material, and keeping the P type electrode and the N type electrode exposed from the light-transmissible packaging material to form a molded LED chip cell; and
   (d) electrically connecting the P type electrode and the N type electrode of the molded LED chip cell to a circuit board, so as to manufacture the LED assembly.

2. The method as claimed in claim 1, wherein the light-emitting layer in the step (a) comprises:
   a light-transmissible conductive sub-layer covering the reflection layer;
   a P type electrode cladding sub-layer covering the light-transmissible conductive sub-layer;
   a light-transmissible multiple quantum well covering the P type electrode cladding sub-layer; and
   an N type electrode cladding sub-layer covering the light-transmissible multiple quantum well.

3. The method as claimed in claim 2, wherein the P type electrode is extended from the P type electrode cladding sub-layer, perforating through the light-transmissible conductive sub-layer and the reflection layer, and exposed from the substrate layer.

4. The method as claimed in claim 2, wherein the N type electrode is extended from the N type electrode cladding sub-layer, perforating through the light-transmissible multiple quantum well, the P type electrode cladding sub-layer, the light-transmissible conductive sub-layer and the reflection layer, and exposed from the substrate layer.

5. The method as claimed in claim 2, wherein the light-transmissible conductive sub-layer is formed by an annealing process for a Nickel-Gold (Ni—Au) metal film under the annealing temperature of 500° C. to 550° C.

6. The method as claimed in claim 1, wherein the reflection layer is composed of at least one compound of titanium dioxide and silicon dioxide ($TiO_2/SiO_2$), aluminum oxide and silicon dioxide ($Al_2O_3/SiO_2$) and silicon nitride and silicon dioxide ($Si_3N_4/SiO_2$).

7. The method as claimed in claim 1, wherein in the step (d), the P type electrode and the N type electrode are electrically connected to the circuit board via a soldering process.

8. The method as claimed in claim 1, wherein the circuit board is a printed circuit board.

9. The method as claimed in claim 8, wherein the printed circuit board is an FR4 (abbreviation for Flame Retardant 4) copper clad laminate.

* * * * *